United States Patent
Kawanishi et al.

(10) Patent No.: US 7,069,285 B2
(45) Date of Patent: Jun. 27, 2006

(54) DECIMATION FILTER

(75) Inventors: Hiroyuki Kawanishi, Tokyo (JP); Akira Toyama, Chigasaki (JP)

(73) Assignee: Nippon Precision Circuits Inc., Tokyo (JP)

( * ) Notice: Subject to any disclaimer, the term of this patent is extended or adjusted under 35 U.S.C. 154(b) by 402 days.

(21) Appl. No.: 10/094,852

(22) Filed: Mar. 11, 2002

(65) Prior Publication Data

US 2002/0143833 A1  Oct. 3, 2002

(30) Foreign Application Priority Data

Mar. 28, 2001  (JP) .............................. 2001-093617

(51) Int. Cl.
*G06F 17/10*  (2006.01)
(52) U.S. Cl. .................................... 708/313
(58) Field of Classification Search ................. 708/313
See application file for complete search history.

(56) References Cited

U.S. PATENT DOCUMENTS 6,750,793 B1 * 6/2004 Takeda ....................... 341/126
6,834,292 B1 * 12/2004 Jiang et al. .................. 708/313

* cited by examiner

*Primary Examiner*—D. H. Malzahn

(74) *Attorney, Agent, or Firm*—Jordan and Hamburg LLP

(57) ABSTRACT

Folding noises into signal bands are reduced and steeper cutoff characteristics are achieved without any increase in the scale of the circuit of a decimation filter attributable to the order of the filter coefficients and the bit precision of the same.

Smaller attenuations are achieved in regions that do not contribute to folding noises, and filter coefficients are used to primarily attenuate signal components in regions contributing to folding noises and having a certain band width located about frequencies that are integral multiples of a decimated sampling frequency of 8 fs, thereby reducing folding noises compared to the prior art. Attenuations smaller than those in the prior art are achieved in other regions that do not contribute to folding noises to allow the filter coefficients to be used to make cutoff characteristics steeper accordingly, thereby achieving steeper cutoff characteristics while keeping folding noises at the level of the prior art.

18 Claims, 9 Drawing Sheets

Fig. 2A

FILTER COEFFICIENTS (24bit, HEX)

| INPUT DATA | | FILTER COEFFICIENTS C | FILTER COEFFICIENTS A | FILTER COEFFICIENTS B |
|---|---|---|---|---|
| H(1) | H(128) | FFFFAE | FFFFCE | FFFD46 |
| H(2) | H(127) | FFFF90 | FFFFC4 | FFFE98 |
| H(3) | H(126) | FFFF4B | FFFF9C | FFFDF3 |
| H(4) | H(125) | FFFEF5 | FFFF61 | FFFD00 |
| H(5) | H(124) | FFFE8F | FFFF0F | FFFBCE |
| H(6) | H(123) | FFFE1D | FFFEA2 | FFFA77 |
| H(7) | H(122) | FFFDA7 | FFFE17 | FFF913 |
| H(8) | H(121) | FFFD39 | FFFD6E | FFF7B8 |
| H(9) | H(120) | FFFCE3 | FFFD55 | FFFDEC |
| H(10) | H(119) | FFFCB7 | FFFC99 | FFF94F |
| H(11) | H(118) | FFFCCC | FFFC32 | FFFA48 |
| H(12) | H(117) | FFFD3B | FFFC06 | FFFC79 |
| H(13) | H(116) | FFFE1B | FFFC34 | FFFFD3 |
| H(14) | H(115) | FFFF85 | FFFCDD | 000441 |
| H(15) | H(114) | 00018D | FFFE25 | 0009AC |
| H(16) | H(113) | 000440 | 000033 | 001016 |
| H(17) | H(112) | 0007A2 | 00022B | 000F25 |
| H(18) | H(111) | 000BAC | 0005E4 | 001AEF |
| H(19) | H(110) | 001047 | 000A1D | 00219B |
| H(20) | H(109) | 00154C | 000F09 | 0027B2 |
| H(21) | H(108) | 001A82 | 001483 | 002CF8 |
| H(22) | H(107) | 001F9C | 001A4F | 00311C |
| H(23) | H(106) | 00243B | 002019 | 0033B6 |
| H(24) | H(105) | 0027F3 | 002574 | 00341E |
| H(25) | H(104) | 002A49 | 002A6F | 0034AC |
| H(26) | H(103) | 002ABB | 002D7B | 002E88 |
| H(27) | H(102) | 0028C9 | 002EB1 | 00267C |
| H(28) | H(101) | 0023F7 | 002D54 | 001ACE |
| H(29) | H(100) | 001BDD | 0028CF | 000B55 |
| H(30) | H(99) | 00102C | 0020A3 | FFF816 |
| H(31) | H(98) | 0000BA | 00146A | FFE14C |
| H(32) | H(97) | FFED8C | 0003EC | FFC774 |

Fig. 2B

FILTER COEFFICIENTS (24bit, HEX)

| INPUT DATA | | FILTER COEFFICIENTS C | FILTER COEFFICIENTS A | FILTER COEFFICIENTS B |
|---|---|---|---|---|
| H(33) | H(96) | FFD6DB | FFEF5E | FFADE1 |
| H(34) | H(95) | FFBD21 | FFD69E | FF8EAA |
| H(35) | H(94) | FFA118 | FFBA7E | FF70DC |
| H(36) | H(93) | FF83C0 | FF9BCD | FF542A |
| H(37) | H(92) | FF665D | FF7BBA | FF39F0 |
| H(38) | H(91) | FF4A71 | FF5BC4 | FF23AF |
| H(39) | H(90) | FF3183 | FF3DB1 | FF1304 |
| H(40) | H(89) | FF1E04 | FF2391 | FF09DB |
| H(41) | H(88) | FF115F | FF0F28 | FF0712 |
| H(42) | H(87) | FF0DC6 | FF0381 | FF11CF |
| H(43) | H(86) | FF152C | FF0269 | FF2738 |
| H(44) | H(85) | FF295D | FF0E29 | FF4988 |
| H(45) | H(84) | FF4BE7 | FF28BD | FF799E |
| H(46) | H(83) | FF7E05 | FF53D0 | FFB80A |
| H(47) | H(82) | FFC086 | FF909B | 0004EB |
| H(48) | H(81) | 0013BE | FFDFD0 | 005FD0 |
| H(49) | H(80) | 007771 | 004178 | 00C750 |
| H(50) | H(79) | 00EAD3 | 00B517 | 013CB6 |
| H(51) | H(78) | 016C7A | 01394F | 01BBEB |
| H(52) | H(77) | 01FA67 | 01CC26 | 024396 |
| H(53) | H(76) | 02920C | 026AED | 02D15B |
| H(54) | H(75) | 03305B | 03125D | 03628A |
| H(55) | H(74) | 03D1DD | 03BEA5 | 03F431 |
| H(56) | H(73) | 0472CB | 046B82 | 0482D0 |
| H(57) | H(72) | 050F31 | 0514DB | 050DF8 |
| H(58) | H(71) | 05A309 | 05B57D | 058DC0 |
| H(59) | H(70) | 062A69 | 064949 | 060252 |
| H(60) | H(69) | 06A19F | 06CBED | 066840 |
| H(61) | H(68) | 07055A | 07398A | 06BD05 |
| H(62) | H(67) | 0752C6 | 078ED4 | 06FE88 |
| H(63) | H(66) | 0787AB | 07C931 | 072B2A |
| H(64) | H(65) | 07A281 | 07E6D7 | 074221 |

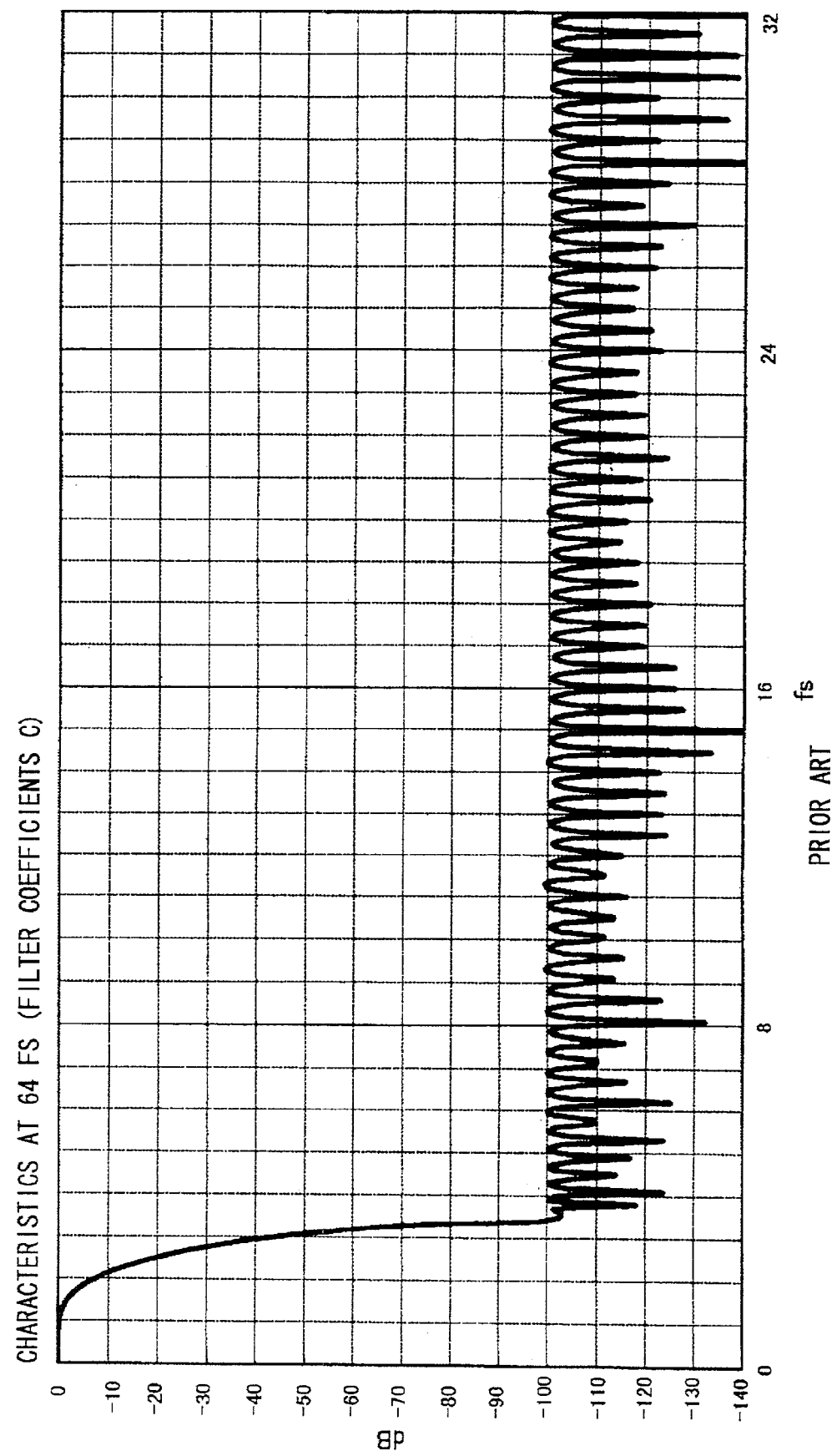

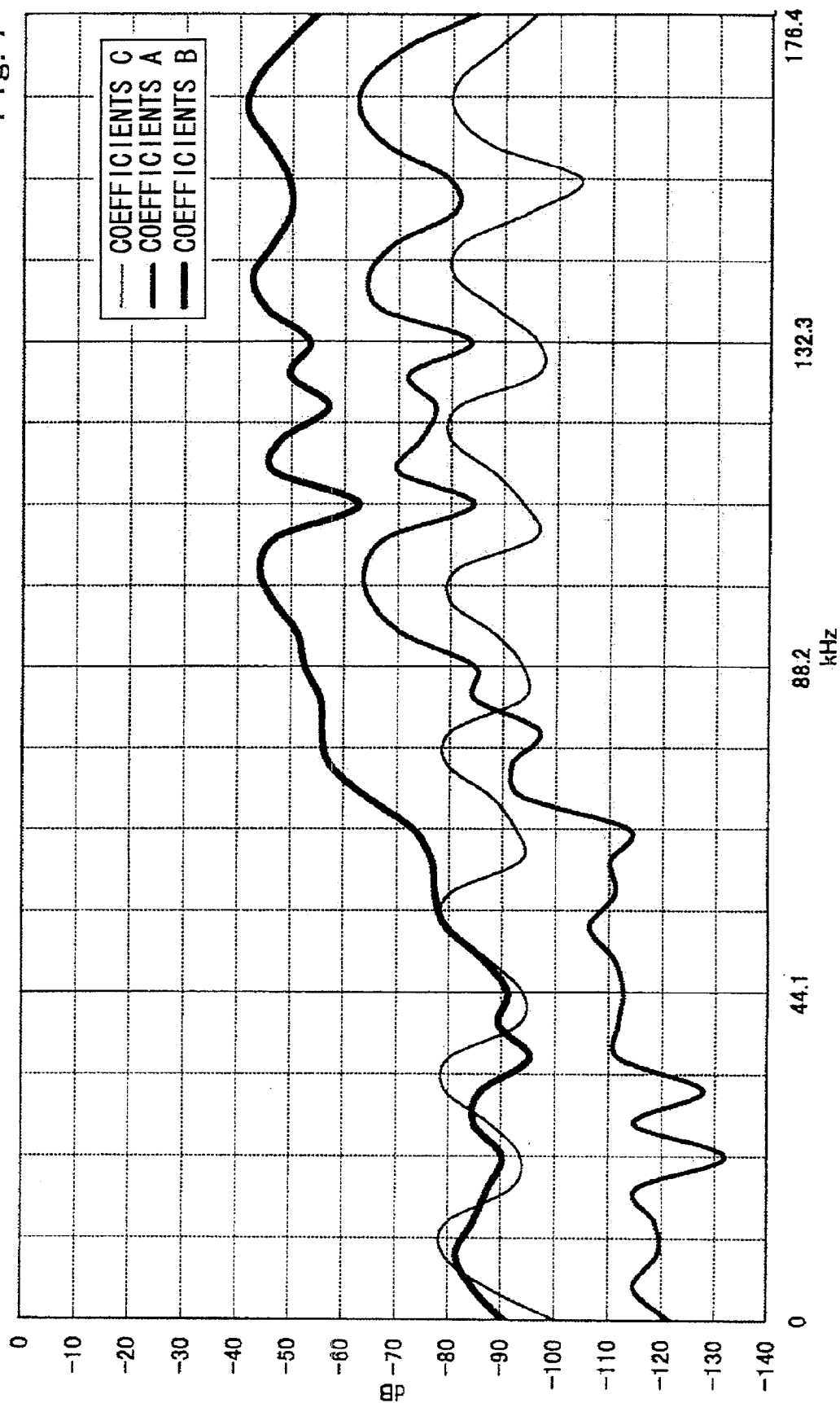

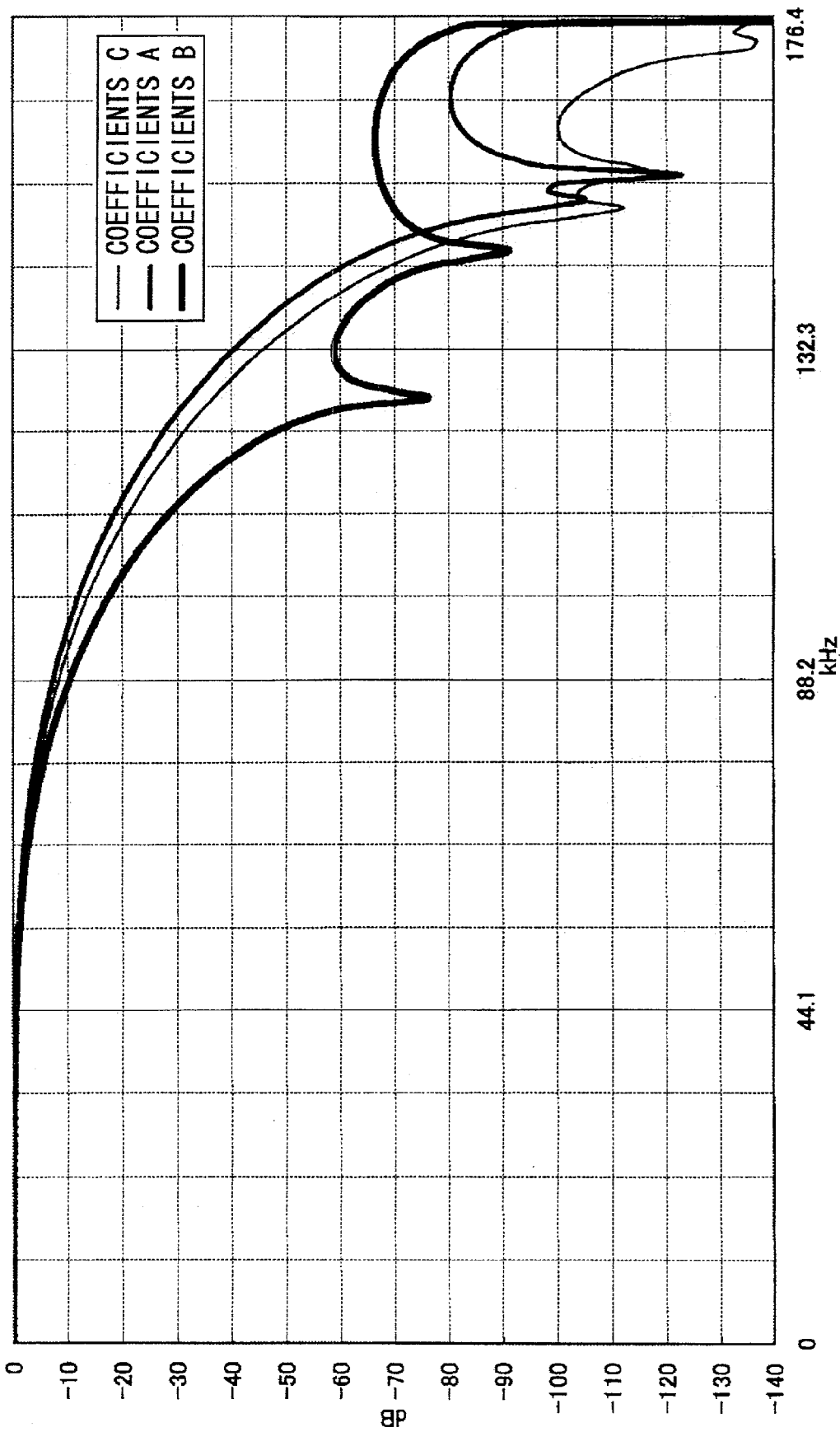

DECIMATION FILTER

BACKGROUND OF THE INVENTION

1. Field of the Invention

The present invention relates to digital filters and, more particularly, to a decimation filter for transforming a signal sampled at a certain sampling frequency into a signal at a lower sampling frequency.

2. Description of the Prior Art

One existing decimation filter transforms a 1-bit digital signal obtained through delta-sigma modulation at a certain sampling frequency, e.g., 64 fs (1 fs=44.1 kHz) into a 32-bit digital signal at a lower sampling frequency, e.g., 8 fs. Such a decimation filter, in particular, an FIR type filter has a configuration as shown in FIG. 1 in which 128 items of 1-bit input data are temporarily stored in input data storing means 1; pairs of the input data are sequentially supplied to calculation means 2 according to an operating clock at a frequency higher than 64 fs, e.g., an operating clock at 512 fs to perform product-sum calculations using filter coefficients sequentially output by coefficient storing means 3; and results of the calculation are output according to an operating clock at 8 fs.

For example, the filter coefficients stored in the coefficient storing means 3 are of an even order and symmetric in that the same filter coefficient is provided for items of input data which are symmetric about the center of the 128 items of input data (which are represented by H(1) through H(128) in FIGS. 2A and 2B) as shown in the filter coefficient C in FIGS. 2A and 2B. That is, 64 filter coefficients are stored in the coefficient storing means 3. Let us assume that the (−i)-th item of input data (for example, when the (−i)-th data is the newest item of data, the item preceding the (−i)-th item is the (−1−i)-th item) is referred to as "input data $a_{-i}$. Then, the input data is calculated using the same filter coefficient that is used for the (−128+i−1)-th item of input data, i.e., input data $a_{-128+i-1}$.

The filter calculations at the calculation means 2 are performed as follows in accordance with an operating clock at 512 fs. The input data storing means 3 sequentially outputs the input data $a_{-i}$ and input data $a_{-128+i-1}$ to the calculation means 2 as a pair of input data. A pre-adder 21 in the calculation means 2 adds states "1" in each of the pairs of input data from the input data storing means 3 as "+1" and adds states "0" as "−1". The coefficient storing means 3 sequentially outputs filter coefficients, and a multiplier 22 multiplies each of the results of calculation from the pre-adder 21 by each of the filter coefficients from the coefficient storing means 3. Each filter coefficient is comprised of one bit representing a sign and 24 bits representing a decimal part, and the multiplier 22 performs a multiplication of 1 bit×24 bits and switches the sign according to a sign bit of each of the pre-adder 21 and coefficient storing means 3. A post-adder 23 adds each of the results of calculation at the multiplier 22 and data held in a 32-bit shift register 24. Thus, a cumulative value of the results of multiplication at the multiplier 22 is held in the register 24. When the product-sum calculation according to the operating clock at 512 fs is performed 64 times, the data in the register 24 are output according to an operating clock at 8 fs to clear the contents of the register 24. A 32-bit digital signal at 8 fs is output from the calculation means 2 by repeating such an operation.

However, folding noises appear in audio signal bands at 20 kHz or less because of bands of approximately ±20 kHz about frequencies that are integral multiples of the decimated frequency. (e.g., 8 fs, 16 fs, 24 fs, 32 fs, 40 fs, and 48 fs in the case of a decimated frequency of 8 fs as in FIG. 1.) In the case of the decimation filter shown in FIG. 1, the filter coefficients are determined such that attenuations of 100 dB or more can be achieved in all cutoff bands as shown in FIG. 3. In order to achieve higher attenuations, the order of filter coefficients used for filter calculations and bit precision of the same must be improved, which has resulted in an increase in the scale of a circuit.

The invention is aimed to reduce folding noises into signal bands without any increase in the scale of a circuit attributable to the order and bit precision of filter coefficients and to provide a decimation filter with which steeper cutoff characteristics can be achieved.

SUMMARY OF THE INVENTION

A decimation filter according to the invention is characterized in that the decimation filter, to which first data forming a first digital signal at a first sampling frequency are sequentially input, and has coefficient storing means in which a predetermined number of filter coefficients are stored in association with each of a series of the first data in the predetermined number; filter calculations are performed using the first data and the filter coefficients associated with the first data to sequentially output second data at a second sampling frequency that is one n-th (n is a positive integer) the first sampling frequency; and the predetermined number of filter coefficients provide greater attenuations in regions having a certain band width about frequencies that are integral multiples of the second sampling frequency in some cutoff bands than attenuations in other cutoff bands.

A decimation filter according to the invention preferably, to which first data forming a first digital signal at a first sampling frequency are sequentially input, has coefficient storing means and in which filter coefficients are stored in a number that is one-half a predetermined number of the first data, the filter coefficients being associated with each pair of the first digital data in a predetermined number that are symmetric about the center of the series of the predetermined number of the first data, multiplication means for multiplying the filter coefficients by the sum of first data associated with the filter coefficients, and accumulation means for accumulating multiplied data from the multiplication means in the quantity that is one-half the predetermined number to sequentially output second data at a second sampling frequency that is one n-th (n is a positive integer) the first sampling frequency, the filter coefficients providing greater attenuations in regions having a certain band width about frequencies that are integral multiples of the second sampling frequency in some cutoff bands than attenuations in other cutoff bands.

Each of partial frequency bands preferably has an expanse that is equal to or smaller than one-half the second sampling frequency and equal to or greater than a signal band on both sides of the frequencies that are integral multiple of the second sampling frequency.

BRIEF DESCRIPTION OF THE DRAWINGS

FIG. 2A is a filter coefficient table showing examples of filter coefficients A and B used for filter calculations according to an embodiment of the invention and filter coefficients C used for conventional filter calculations;

FIG. 2B is a continuation of the filter coefficient table showing a filter coefficient table showing examples of filter coefficients A and B used for filter calculations according to an embodiment of the invention and filter coefficients C used for conventional filter calculations;

FIG. 3 is a characteristic diagram showing attenuation characteristics achieved with the filter coefficients C used for filter calculations in a conventional decimation filter;

FIG. 7 is a characteristic diagram showing folding noise characteristics achieved with the filter coefficients A, B, and C used for filter calculations; and FIG. 8 is a characteristic diagram showing cutoff characteristics achieved with the filter coefficients A, B, and C used for filter calculations.

DETAILED DESCRIPTION OF THE PREFERRED EMBODIMENT

Figure 1:
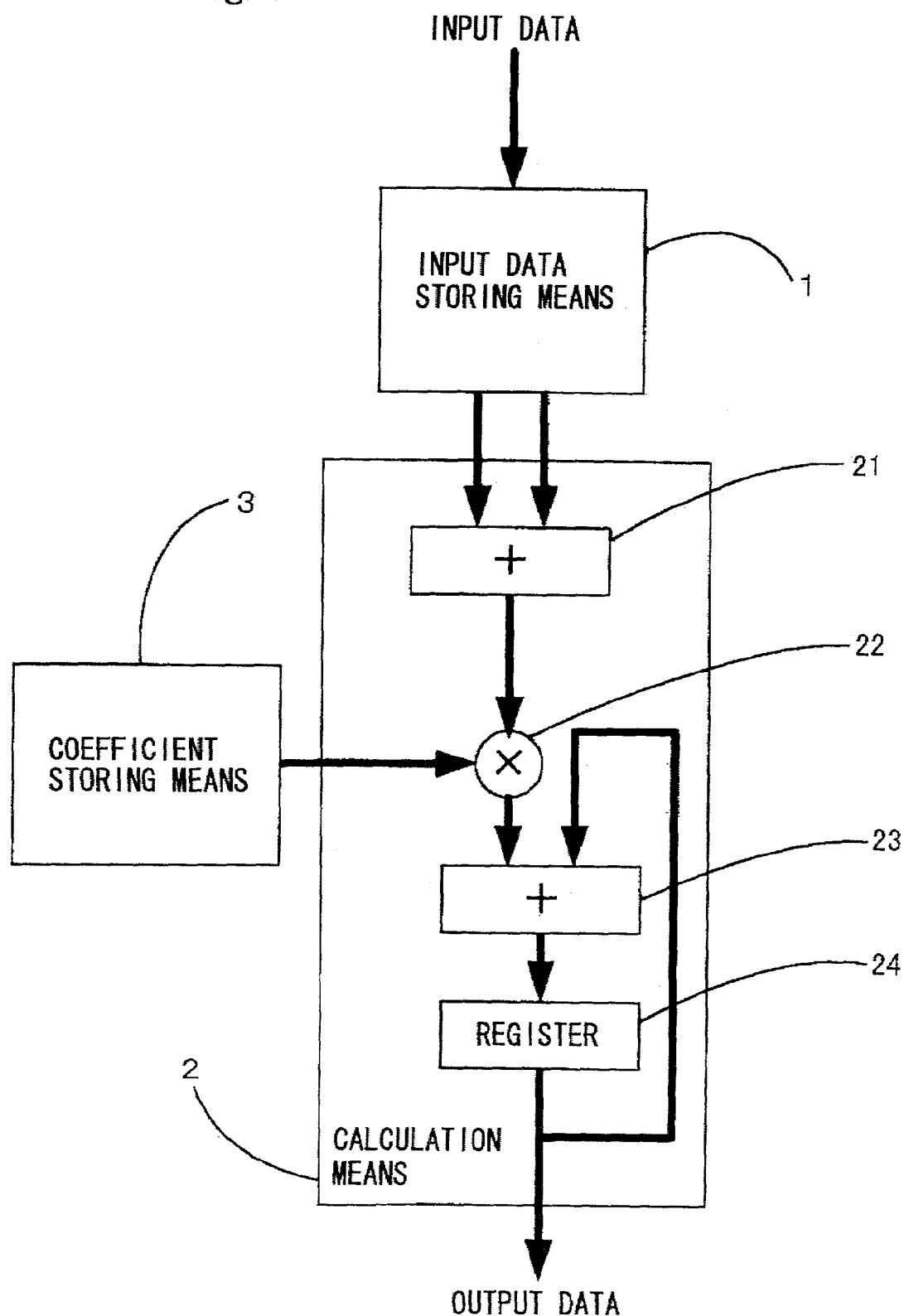
FIG. 1 is a block diagram illustrating a configuration of a decimation filter.

A mode for carrying out the invention will now be described in detail with reference to a preferred embodiment of the invention. FIG. 1 is a block diagram showing a configuration of a decimation filter according to an embodiment of the invention. The circuit configuration will now be described, although it is similar to conventional configurations. The decimation filter of the present embodiment is an FIR type filter that transforms a 1-bit digital signal obtained through delta-sigma modulation at a sampling frequency of 64 fs (1 fs =44.1 kHz), for example, into a 32-bit digital signal at lower sampling frequency, e.g., 8 fs.

Input data storing means 1 is constituted by a shift register for storing a predetermined number of 1-bit input data, e.g., 128 items of 1-bit input data. It sequentially shifts and updates the data and outputs a pair of data which are to be multiplied by the same filter coefficient to be described later.

Calculation means 2 performs filter calculations as described below. It adds states "1" and sates "0" of a pair of input data associated with the same filter coefficient as "+1" and "−1" respectively using a pre-adder 21 incorporated therein according to an operating clock at a frequency higher than 64 fs, e.g., an operating clock at 512 fs. The sum is multiplied by the results of addition and 24-bit filter coefficients that are output by coefficient storing means 3 at appropriate timing at a 1×24 bit multiplier 22, and a post-adder 23 performs product-sum calculations by adding the results of calculation and data held in a register 24. When the product-sum calculations according to the operating clock at 512 fs is performed 64 times, the data in the register 24 are output as data decimated to 8 fs, and the register 24 is cleared to start the next product-sum calculation.

For example, the filter coefficients stored in the coefficient storing means 3 are of an even order and symmetric. As apparent from the filter coefficients A in FIGS. 2A and 2B, the same filter coefficient is provided for items of input data which are located symmetrically about the center of the 128 items of input data (which are represented by H(1) through H(128) in FIGS. 2A and 2B) sequentially arranged in the input data storing means 1. That is, 64 filter coefficients are stored in the coefficient storing means 3. Let us assume that the (−i)-th item of input data (for example, when the (−i)-th data is the newest item of data, the item preceding the (−i)-th item is the (−1−i)-th item) is referred to as "input data $a_{-i}$. Then, the input data is calculated using the same filter coefficient that is used for the (−128+i−1)-th item of input data, i.e., input data $a_{-128+i-1}$.

The filter coefficients stored in the coefficient storing means 3 of the present embodiment will now be described.

Figure 4:
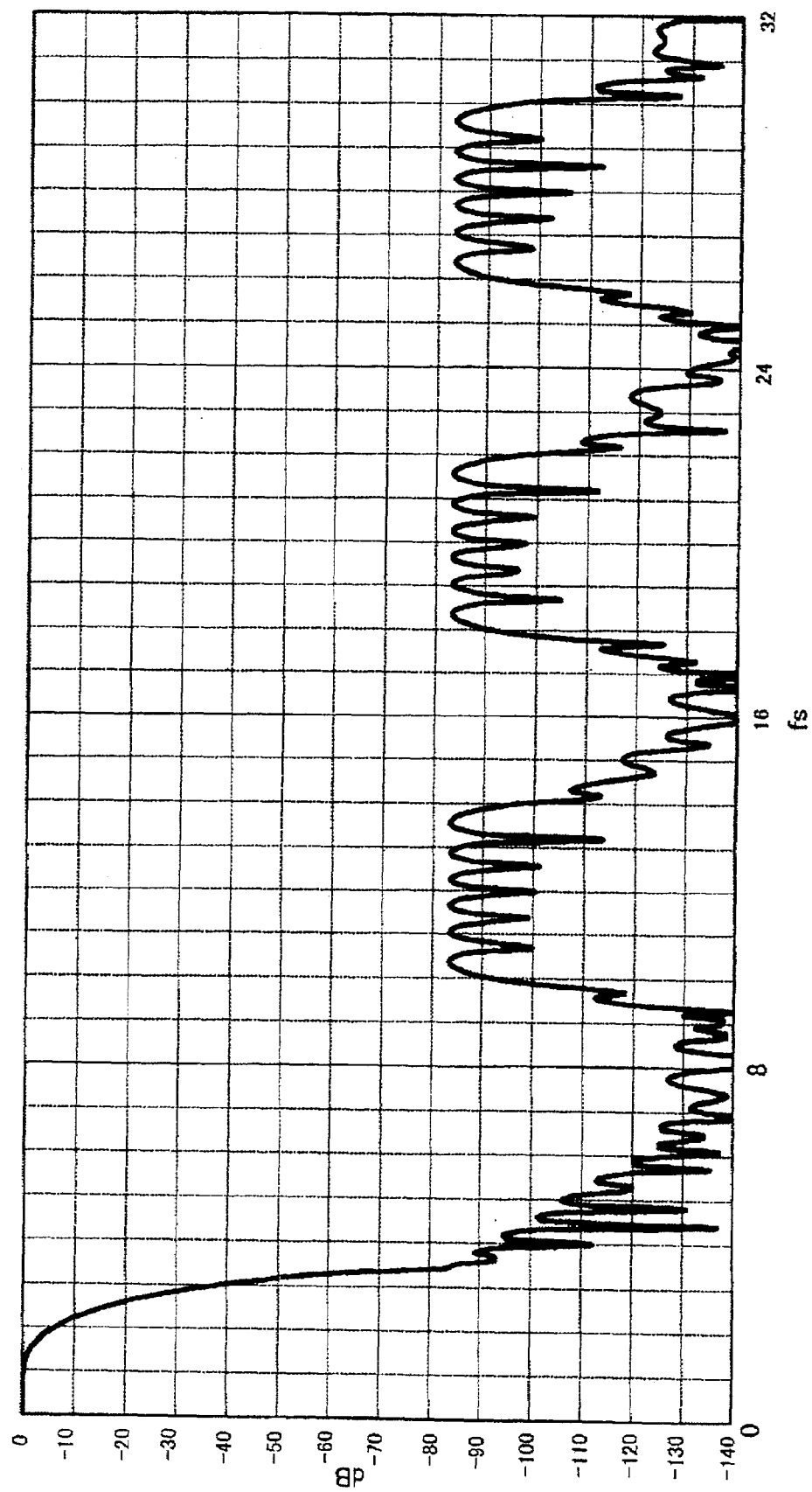
FIG. 4 is a characteristic diagram showing attenuation characteristics achieved with the filter coefficients A used for filter calculations in a decimation filter of the embodiment of the invention.
Figure 5:
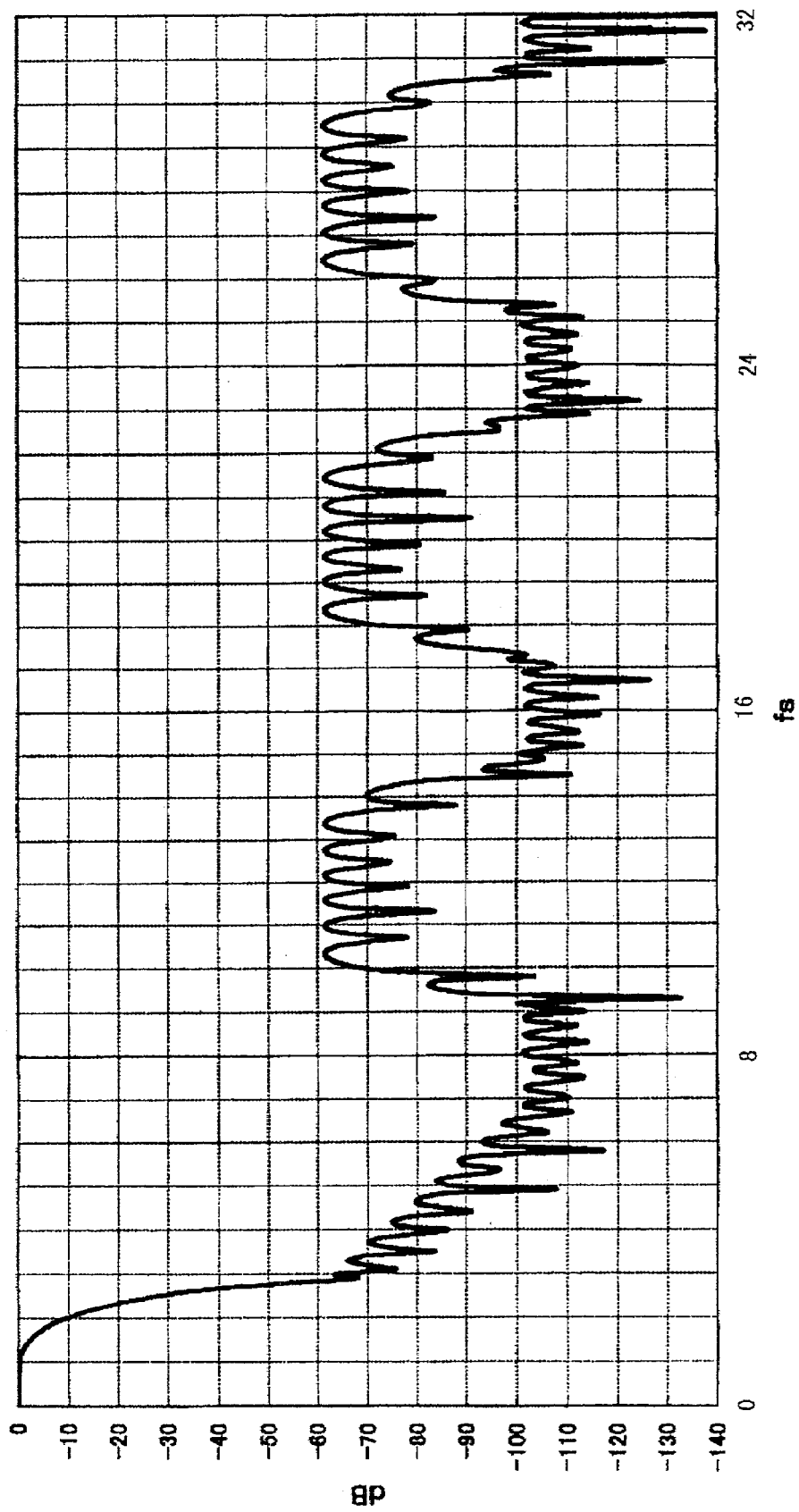
FIG. 5 is a characteristic diagram showing attenuation characteristics achieved with the filter coefficients B used for filter calculations in the decimation filter of the embodiment of the invention.

In a conventional decimation filter, the filter coefficients C in the filter coefficient table in FIGS. 2A and 2B are used to achieve flat cutoff characteristics as shown in FIG. 3. FIG. 3 was obtained by carrying out DFT at 320 points up to a frequency of 32 fs using the filter coefficients C in the filter coefficient table in FIGS. 2A and 2B. In the conventional filter, the filter coefficients C are set such that a flat attenuation of −100 dB will be achieved in cut-off bands. On the contrary, in the decimation filter of the present embodiment, the filter coefficients A or B in the filter coefficient table in FIGS. 2A and 2B are used to achieve great and small attenuations as shown in FIGS. 4 and 5 instead of achieving flat characteristics in the cutoff bands. FIGS. 4 and 5 were obtained by carrying out DFT at 320 points up to a frequency of 32 fs using the filter coefficients A and B in the filter coefficient table in FIGS. 2A and 2B. Referring to folding noises into audio signal bands at 20 kHz or less that significant contribute to the characteristics of a decimation filter, noises exist in bands that are located on both sides of frequencies which are integral multiples of a decimated sampling frequency, the bands having an expanse that is equal to or smaller than one-half the decimated sampling frequency and that is equal to or greater than the signal bands. In the present embodiment, noises exist in bands of approximately ±20 kHz about frequencies that are integral multiples of a decimated frequency of 8 fs (8 fs, 16 fs, 24 fs, 32 fs, 40 fs, 48 fs, and 56 fs). The present embodiment focuses on this point, and greater attenuations are achieved in regions of approximately ±20 kHz about the frequencies that are integral multiples of the decimated frequency of 8 fs and smaller attenuations are achieved in other regions. This makes it possible to improve folding noise characteristics that affect effective signal bands and to achieve steeper cutoff frequencies with filter coefficients of the same order having the same bit precision.

In the present embodiment, the filter coefficients are determined by performing weighting to provide a difference of about 50 dB between attenuations in regions that contribute to folding noises as described above and attenuations in other regions of cutoff bands. The filter coefficients A are determined to improve folding noise characteristics. The filter coefficients B are determined to achieve steeper cutoff characteristics with folding noise characteristics kept unchanged.

Figure 6:
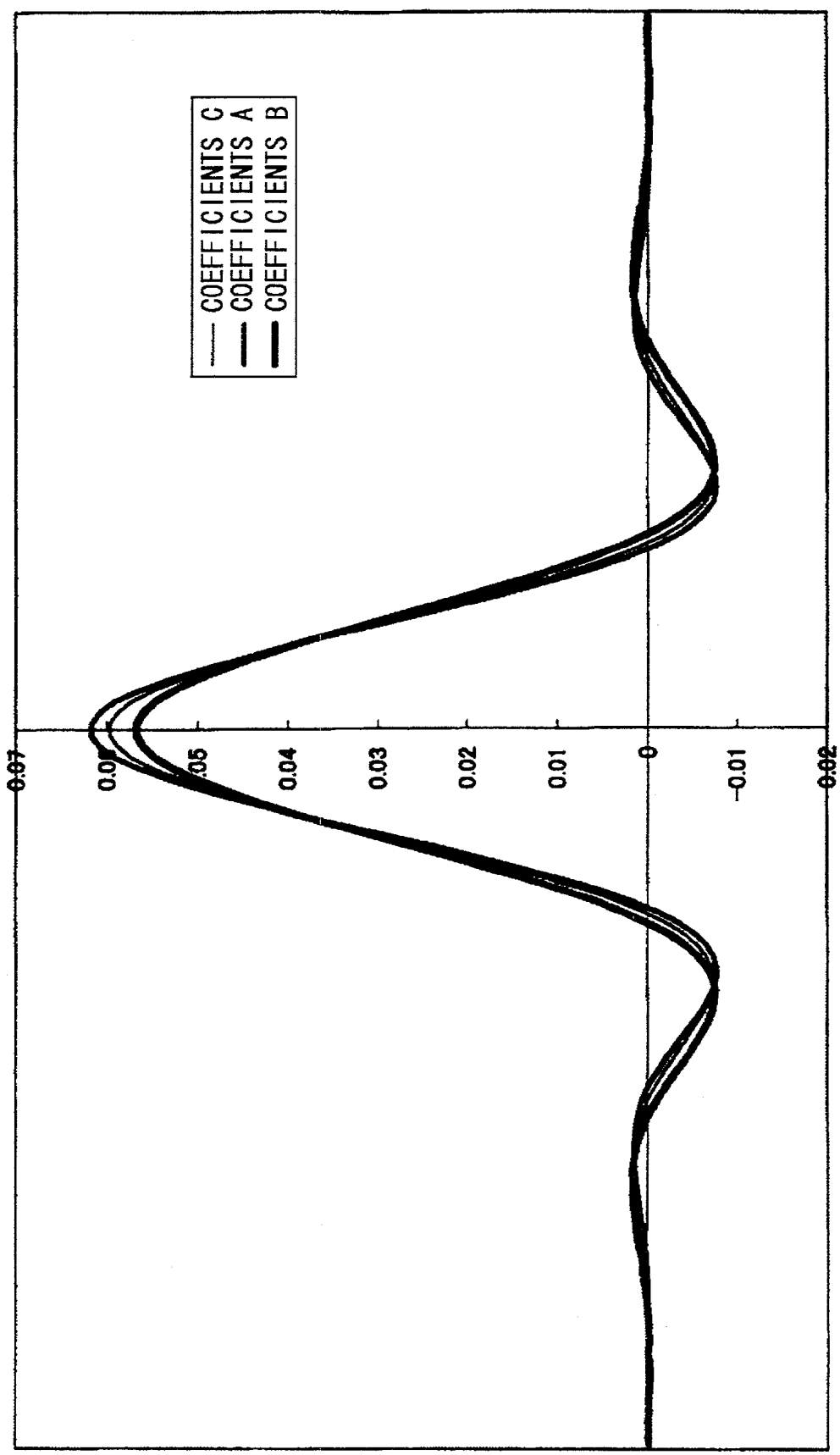
FIG. 6 is a characteristic diagram showing impulse responses achieved with the filter coefficients A, B, and C used for filter calculations.

Decimation filters utilizing the filter coefficients A and B of the present embodiment and a conventional decimation filter utilizing the filter coefficients C respectively have impulse responses as indicated by A, B, and C in FIG. 6, folding noise characteristics after decimation to a frequency of 8 fs as indicated by A, B, and C in FIG. 7, and cutoff characteristics after decimation to a frequency of 8 fs as indicated by A, B, and C in FIG. 8. FIG. 8 shows cutoff characteristics achieved by performing DFT at 320 points on impulse responses decimated to 8 fs using filter coefficients of up to 4 fs.

With the filter of the present embodiment utilizing the filter coefficients A, noise characteristics are improved by −20 dB to −30 dB from those of the conventional filter in audio signal bands as shown in FIG. 7 by achieving attenuations in the range from −120 dB to −130 dB in regions that contribute to folding noises as described above.

In the case of the filter utilizing the filter coefficients B, steeper cutoff characteristics are achieved with attenuations in regions other than the regions contributing to noises in cutoff bands kept small as shown in FIG. 5, which makes it possible to improve cutoff characteristics after decimation to a frequency of 8 fs as shown in FIG. 8. This also makes it possible to achieve folding noise characteristics equivalent to those of the conventional filter in audio signal bands as shown in FIG. 7.

As described above, the present embodiment makes it possible to reduce folding noises and to achieve steeper cutoff characteristics by setting appropriate attenuations in cutoff bands though selection of filter coefficient characteristics even with filter coefficients of the same order having the same bit precision.

Although not described in detail, the filter coefficients A and B are set by setting certain frequencies and repeating trials until characteristics as described above are achieved in which a great attenuation is achieved in each of bands of approximately ±20 kHz about frequencies that are integral multiples of decimated frequencies in accordance with the Remez algorithm.

Although an FIR filter utilizing symmetric filter coefficients of an even order has been described by way of example in the above embodiment, the present embodiment is not limited to the same and may be applied to an IIR filter. The invention is not limited to symmetric filter coefficients of an even order too and may be applied to any digital filter utilizing filter coefficients that can be used in combinations to achieve greater attenuations in regions contributing to folding noises in cutoff bands as described above than in other regions. The configuration of the calculation means 2 may be also changed appropriately, and the number of bits of input data, the sampling frequencies, and the number of bits of filter coefficients may be also changed appropriately.

According to the present invention, the filter coefficients of a decimation filter for performing filter calculations on a first digital signal at a first sampling frequency to output a second digital signal at a second sampling frequency lower than the first sampling frequency are set such that greater attenuations are achieved in regions having a certain band width about frequencies that are integral multiples of the second sampling frequency in some cutoff bands than attenuations in other cutoff bands. This makes it possible to reduce folding noises compared to the prior art by achieving small attenuations in other regions that do not contribute to folding noises and by using filter coefficients to primarily attenuate signal components in the regions which contribute to folding noises and which have a certain band width about the frequencies that are integral multiples of the second sampling frequency. It is also possible to achieve steeper cutoff characteristics by achieving smaller attenuations in the other regions that do not contribute too folding noises than those in the prior art and by keeping attenuations in the regions contributing to folding noises at a level similar to that in the prior art, thereby allowing filter coefficients to be used for achieving steeper cutoff characteristics, accordingly.

As described above, the invention makes it possible to reduce folding noises into signal bands and to achieve steeper cutoff characteristics without any increase in the scale of a circuit attributable to the order of filter coefficients used for filter calculations and the bit precision of the same.

What is claimed is:

1. A decimation filter for accepting first data at a first sampling frequency and outputting second data at a second sampling frequency, for removing folding noises from an output signal produced from said second data and having an output signal bandwidth, comprising:
   input data storing means for storing said first data standardized at said first sampling frequency are input;
   filter coefficient storing means in which a predetermined number of filter coefficients are stored in association with each of a series of the first data in the predetermined number;
   calculation means for generating said second data by calculation using the first data and the filter coefficients associated with the first data to output said second data at said second sampling frequency, wherein said second sampling frequency is equal to said first sampling frequency divided by an integer n; and
   said filter coefficients providing a filter output characteristic such that cutoff frequency bands, having a bandwidth at least equal to said output signal bandwidth and disposed on upper and lower sides of frequencies that are integer multiples of the second sampling frequency, have a minimum attenuation level greater than a minimum attenuation level of outer frequency bands on upper and lower sides of said cutoff frequency bands and extending therebetween.

2. The decimation filter of claim 1, wherein:
   said first data includes a plurality of digital data standardized;
   said filter coefficients are stored in a number that is one half a predetermined number of the first data, the filter coefficients each being associated with pairs data of the plurality of digital data that are symmetric about a center of the series of the plurality of digital; and
   said calculation means includes:
      multiplication means for multiplying the filter coefficients by a sum of the two digital data associated with the filter coefficients; and
      accumulation means for generating said second data by accumulation of multiplied data from the multiplication means to output the second data at the second sampling frequency.

3. The decimation filter of claim 2, wherein said bandwidth of said cutoff frequency bands are equal to or smaller than one-half the second sampling frequency and equal to or greater than said output signal bandwidth.

4. The decimation filter of claim 3, wherein a difference between said minimum attenuation level of said cutoff frequency bands and said minimum attenuation of said outer frequency bands is about 50 dB.

5. The decimation filter of claim 4, wherein said bandwidth of said cutoff frequency bands is equal to approximately 20 kHz.

6. The decimation filter of claim 5, wherein the filter coefficients are symmetric filter coefficients.

7. The decimation filter of claim 2, wherein a difference between said minimum attenuation level of said cutoff frequency bands and said minimum attenuation of said outer frequency bands is about 50 dB.

8. The decimation filter of claim 7, wherein said bandwidth of said cutoff frequency bands is equal to approximately 20 kHz.

9. The decimation filter of claim 8, wherein the filter coefficients are symmetric filter coefficients.

10. The decimation filter of claim 2, wherein said bandwidth of said cutoff frequency bands is equal to approximately 20 kHz.

11. The decimation filter of claim 10, wherein the filter coefficients are symmetric filter coefficients.

12. The decimation filter of claim 2, wherein the filter coefficients are symmetric filter coefficients.

13. The decimation filter of claim 1, wherein a difference between said minimum attenuation level of said cutoff frequency bands and said minimum attenuation of said outer frequency bands is about 50dB.

14. The decimation filter of claim 13, wherein said bandwidth of said cutoff frequency bands is equal to approximately 20 kHz.

15. The decimation filter of claim 14, wherein the filter coefficients are symmetric filter coefficients.

16. The decimation filter of claim 1, wherein said bandwidth of said cutoff frequency bands is equal to approximately 20 kHz.

17. The decimation filter of claim 16, wherein the filter coefficients are symmetric filter coefficients.

18. The decimation filter of claim 1, wherein the filter coefficients are symmetric filter coefficients.

* * * * *